(12) United States Patent
Cheng et al.

(10) Patent No.: US 10,367,060 B2
(45) Date of Patent: Jul. 30, 2019

(54) III-V SEMICONDUCTOR DEVICES WITH SELECTIVE OXIDATION

(71) Applicant: International Business Machines Corporation, Armonk, NY (US)

(72) Inventors: Cheng-Wei Cheng, White Plains, NY (US); Effendi Leobandung, Stormville, NY (US); Devendra K. Sadana, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 133 days.

(21) Appl. No.: 15/136,048

(22) Filed: Apr. 22, 2016

(65) Prior Publication Data
US 2016/0240613 A1 Aug. 18, 2016

Related U.S. Application Data

(62) Division of application No. 14/547,181, filed on Nov. 19, 2014, now abandoned.

(51) Int. Cl.
*H01L 29/06* (2006.01)
*H01L 21/84* (2006.01)
(Continued)

(52) U.S. Cl.
CPC .... *H01L 29/0673* (2013.01); *H01L 21/02233* (2013.01); *H01L 21/845* (2013.01);
(Continued)

(58) Field of Classification Search
CPC .......... H01L 21/02233; H01L 21/02241; H01L 21/31111; H01L 21/845; H01L 29/0673
See application file for complete search history.

(56) References Cited

U.S. PATENT DOCUMENTS

| 5,747,838 A | 5/1998 | Mishra et al. |
| 6,266,357 B1 | 7/2001 | Feld et al. |

(Continued)

FOREIGN PATENT DOCUMENTS

EP     1060541 B1    5/2003

OTHER PUBLICATIONS

Ye et al.; "GaAs metal-oxide-semiconductor field-effect transistor with nanometer-thin dielectric grown by atomic layer deposition"; Applied Physics Letters; vol. 83, No. 1; Jul. 7, 2003; p. 180.
(Continued)

*Primary Examiner* — Tuan A Hoang
(74) *Attorney, Agent, or Firm* — Alexa L. Ashworth; Brian M. Restauro; Chistopher M. Pignato

(57) ABSTRACT

Embodiments of the present invention provide methods for fabricating a semiconductor device with selective oxidation. One method may include providing a semiconductor substrate including a stack of two semiconductor layers; depositing an insulating material on the semiconductor substrate; forming a set of fins; selectively oxidizing one of the semiconductor layers; forming a dummy gate structure and a set of spacers along the sides of the dummy gate structure; forming a source drain region adjacent to the dummy gate structure; removing the dummy gate structure; and releasing the selectively oxidized semiconductor layer.

8 Claims, 16 Drawing Sheets

(51) Int. Cl.
  *H01L 21/02* (2006.01)
  *H01L 29/423* (2006.01)
  *H01L 29/66* (2006.01)
  *H01L 29/786* (2006.01)
  *H01L 29/51* (2006.01)
  *H01L 21/311* (2006.01)
  *H01L 29/20* (2006.01)

(52) U.S. Cl.
  CPC .. *H01L 29/42392* (2013.01); *H01L 29/66545* (2013.01); *H01L 29/66742* (2013.01); *H01L 29/66795* (2013.01); *H01L 29/78681* (2013.01); *H01L 29/78696* (2013.01); H01L 21/02241 (2013.01); H01L 21/02255 (2013.01); H01L 21/31111 (2013.01); H01L 29/20 (2013.01); H01L 29/517 (2013.01)

(56) References Cited

U.S. PATENT DOCUMENTS

| | | | |
|---|---|---|---|
| 6,583,015 B2 * | 6/2003 | Fitzgerald | H01L 21/02381 257/E21.129 |
| 7,061,955 B2 | 6/2006 | Kim et al. | |
| 7,330,495 B2 | 2/2008 | Takahashi | |
| 7,838,392 B2 * | 11/2010 | Langdo | H01L 21/28518 257/E21.567 |
| 8,513,067 B2 | 8/2013 | Huang et al. | |
| 8,753,942 B2 * | 6/2014 | Kuhn | B82Y 10/00 438/285 |
| 9,312,344 B2 | 4/2016 | Holland et al. | |
| 2007/0091966 A1 | 4/2007 | Hino et al. | |
| 2013/0153996 A1 * | 6/2013 | Chang | B82Y 10/00 257/334 |
| 2014/0035041 A1 | 2/2014 | Pillariselly et al. | |
| 2014/0209865 A1 | 7/2014 | Pillarisetty et al. | |
| 2014/0225065 A1 * | 8/2014 | Rachmady | H01L 29/42392 257/24 |
| 2015/0034899 A1 * | 2/2015 | Ching | H01L 29/66439 257/9 |
| 2015/0104918 A1 * | 4/2015 | Liu | H01L 29/42392 438/283 |
| 2016/0141360 A1 | 5/2016 | Cheng et al. | |

OTHER PUBLICATIONS

Akatsu et al.; "Materials Science in Semiconductor Processing 9"; pp. 444-448; Published by Elsevier in 2006.

Choquette et al., "Advances in Selective Wet Oxidation of AlGaAs Alloys", IEEE Journal of Selected Topics in Quantum Electronics, vol. 3, No. 3, Jun. 1997, pp. 916-926, © 1997 IEEE.

Hussey et al.; "Oxidation of Metals"; vol. 57; p. 427; Published by Plenum Publishing Corporation in 2002.

U.S. Appl. No. 14/547,181, filed Nov. 19, 2014; Entitled "III-V Semiconductor Devices With Selective Oxidation";.

List of IBM Patents or Patent Applications Treated As Related; Dated Apr. 22, 2016; 2 pages.

Akatsu et al.; "Germanium-on-insulator (GeOI) substrates—A novel engineered substrate for future high performance devices"; Materials Science in Semiconductor Processing; vol. 9, Issues 4-5, Aug.-Oct. 2006, pp. 444-448.

Lee et al.; "Wet oxidation of AlAs grown by molecular beam epitaxy"; Applied Physics Letters; vol. 65; Nov. 21, 1994; p. 2717.

* cited by examiner

III-V SEMICONDUCTOR DEVICES WITH SELECTIVE OXIDATION

BACKGROUND OF THE INVENTION

The present invention relates generally to semiconductor devices, and more particularly to the formation of III-V semiconductor devices with starting layers which can be selectively oxidized.

The fabrication of semiconductor devices involves forming electronic components in and on semiconductor substrates, such as silicon wafers. These electronic components may include one or more conductive layers, one or more insulation layers, and doped regions formed by implanting various dopants into portions of a semiconductor substrate to achieve specific electrical properties. Semiconductor devices include transistors, resistors, capacitors, and the like, with intermediate and overlying metallization patterns at varying levels, separated by dielectric materials, which interconnect the semiconductor devices to form integrated circuits.

To electrically isolate semiconductor devices from each other, various isolation techniques, such as trench isolation structures, have been used. Viewing the vertical direction as into the depth, or thickness, of a given substrate and the horizontal direction as being parallel to a top surface of the substrate, a trench isolation structure is vertically oriented to provide insulating separation between semiconductor devices at different horizontal locations. Traditionally, a semiconductor surface is etched to form separate device regions, and resulting trenches in between the separate device regions are filled with dielectric material to form the trench isolation structures.

A semiconductor substrate may also employ semiconductor-on-insulator substrate arrangements, such as silicon-on-insulator (SOI) substrates. In a semiconductor on insulator arrangement, a semiconductor layer can be formed above an insulation layer which has been formed on the semiconductor substrate. Devices can be formed in the top semiconductor layer. The insulating layer provides isolation from the substrate, thereby decreasing capacitance effects for both devices and electrical connections. The top semiconductor layer can be etched, as described above, to provide trench isolation between device regions.

Growing an epitaxial insulating layer on a semiconductor substrate is known. Oxides such as strontium titanium oxides (e.g., $SrTiO_3$) and yttrium oxides (e.g., $Y_2O_3$) have been grown on silicon substrates. More recently, epitaxial structures with closer lattice-matching have been grown, allowing for silicon substrate/epitaxial oxide/epitaxial silicon multi-layer structures. Grown epitaxial oxides with closer lattice-matching properties include oxides of rare earth metals and rare earth metal alloys, such as cerium, yttrium, lanthanum, samarium, gadolinium, europium, and combinations thereof (e.g., cerium oxides ($CeO_2$) and lanthanum yttrium oxides ($La_xY_{1-x})_2O_3$).

SUMMARY

According to one embodiment of the present invention, a method for fabricating a semiconductor device with selective oxidation is provided, the method comprising: providing a semiconductor substrate comprising a stack of two crystalline semiconductor layers, wherein the stack of two crystalline semiconductor layers are disposed on a top surface of the semiconductor substrate; depositing an insulating material on the semiconductor substrate; etching one or more recesses into the insulating material to form a set of fins; selectively oxidizing one of the two crystalline semiconductor layers; forming a dummy gate structure and a set of spacers along sides of the dummy gate structure; forming a source drain region adjacent to the dummy gate structure; removing the dummy gate structure; and releasing the selectively oxidized crystalline semiconductor layer.

According to another embodiment of the present invention, a semiconductor structure is provided, the semiconductor structure comprising: a stack of two crystalline semiconductor layers grown on a starting semiconductor substrate, wherein the stack of two crystalline semiconductor layers comprises a first layer and a second layer; a plurality of fins patterned in the starting semiconductor substrate; a gate structure and a set of spacers, wherein a portion of the gate structure and the set of spacers are disposed around the plurality of fins; a source drain region formed adjacent to the gate structure; and a high-K dielectric material disposed around the gate structure.

DETAILED DESCRIPTION

Figure 1A:
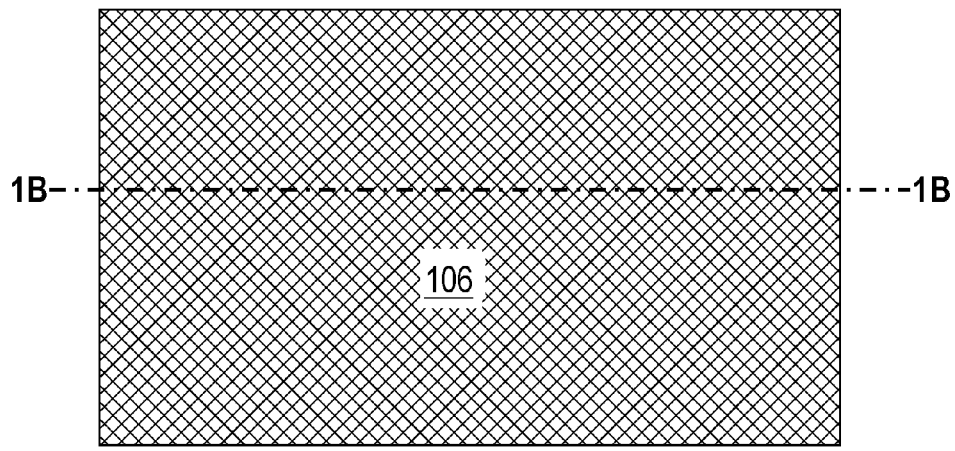
FIGS. 1A and 1B depict a plan view and a cross-sectional view of a starting semiconductor substrate on which a III-V device with selective oxidation may be formed, in accordance with an embodiment of the present invention.

The formation of nanowires on a Si substrate may be difficult when crystalline semiconductors are stacked on an insulator. Embodiments of the present invention provide a fabrication process for a III-V semiconductor device with crystalline starting layers which are subsequently selectively oxidized to become an insulator. Growing the starting layer as a semiconductor layer is less defective than growing a single crystal insulator starting layer. Detailed description of embodiments of the claimed structures and methods are disclosed herein; however, it is to be understood that the disclosed embodiments are merely illustrative of the claimed structures and methods that may be embodied in various forms. In addition, each of the examples given in connection with the various embodiments is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "on", "over", "overlying", "atop", "positioned on", or "positioned atop" mean that a first element, such as a first structure, is present on a second element, such as a second structure, wherein intervening elements, such as an interface structure, may be present between the first element and the second element. The terms "direct contact", "directly on", or "directly over" mean that a first element, such as a first structure, and a second element, such as a second structure, are connected without any intermediary conducting, insulating, or semiconductor layers at the interface of the two elements. The terms "connected" or "coupled" mean that one element is directly connected or coupled to another element, or intervening elements may be present. The terms "directly connected" or "directly coupled" mean that one element is connected or coupled to another element without any intermediary elements present.

Figure 1B:
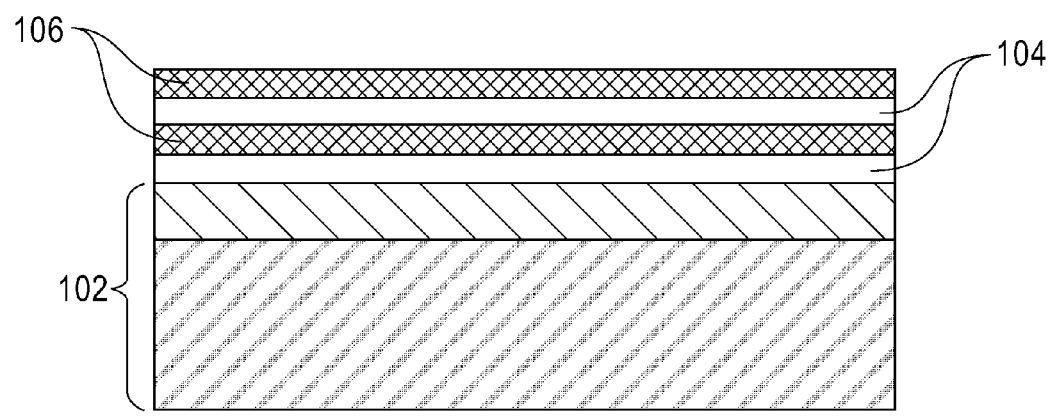

Referring now to the figures, FIG. 1A is a plan view of a starting substrate on which III-V devices with selective oxidation may be formed, and FIG. 1B is a cross-sectional view of FIG. 1A, taken along the line 1B-1B. The starting substrate includes base layer(s) 102, and may be composed of any crystalline material(s) known in the art. In this exemplary embodiment, base layer(s) 102 includes a layer of germanium (Ge), which is approximately from 100 nanometers (nm) to 1 micrometer (μm) in thickness, on top of an insulator. A stack of two crystalline semiconductor layers, layer 104 and layer 106 are grown on the top surface of base layer(s) 102. In this exemplary embodiment, layer 104 is a single crystal semiconductor material composed of Aluminum arsenide (AlAs), and is approximately 10 nm in thickness. In other embodiments, layer 104 may be composed of any semiconductor material capable of being oxidized to a mechanically stable insulator. Layer 106 is a single crystal semiconductor layer, and may be composed of indium gallium arsenide (InGaAs), gallium arsenide (GaAs), III-V materials, or any other semiconducting material. In this exemplary embodiment, layer 106 is composed of InGaAs and is approximately 10 nm in thickness. As depicted in FIG. 1B, there are two stacks (i.e., grouping of one layer 104 and one layer 106) formed on the top surface of base layer(s) 102. In other embodiments, more than two stacks or a single stack may be formed on the top surface of base layer(s) 102.

Figure 2A:
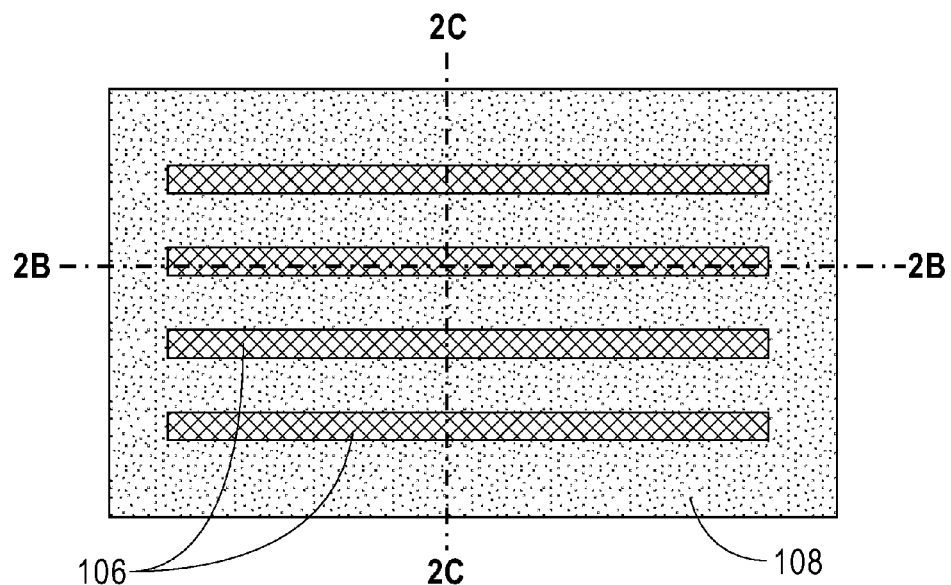
FIGS. 2A-C depict a plan view and cross-sectional views of an embodiment where device regions are created on the starting substrate of FIGS. 1A and 1B through shallow trench isolation, in accordance with an embodiment of the present invention.
Figure 2B:
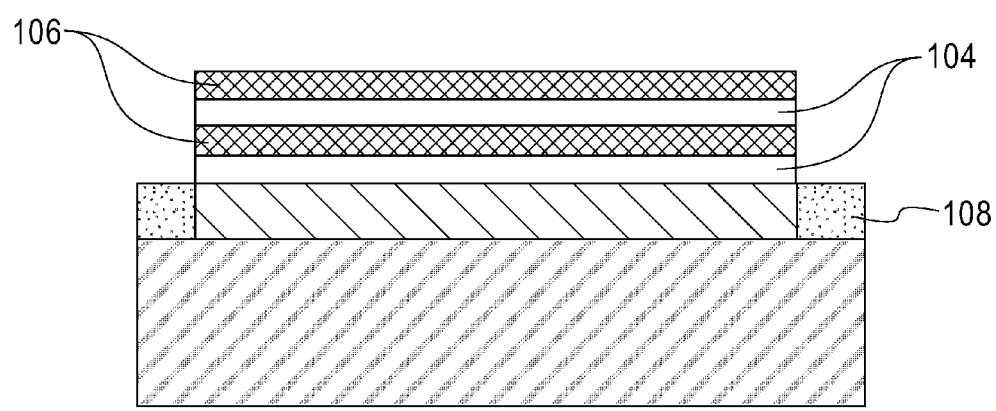
Figure 2C:
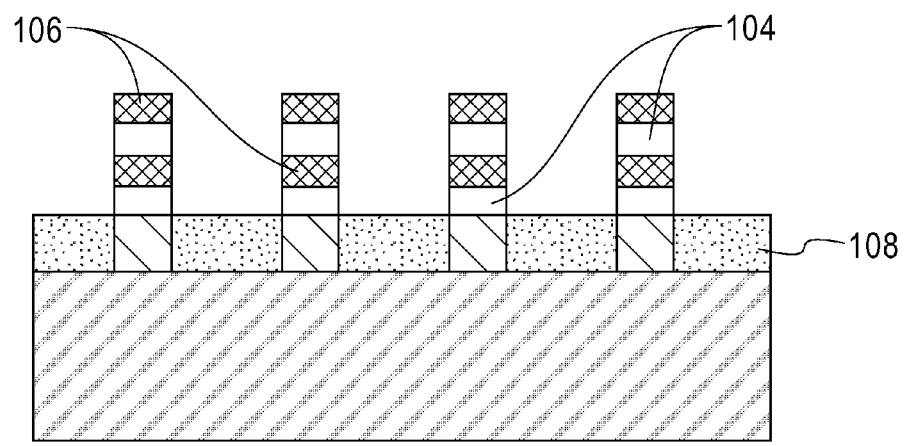

Referring now to FIGS. 2A-C, FIG. 2A is a plan view of the processing step of fin regions patterned on the starting substrate of FIGS. 1A and 1B, FIG. 2B is a cross-sectional view of FIG. 2A, taken along the line 2B-2B, and FIG. 2C is a cross-sectional view of FIG. 2A, taken along the line 2C-2C. The fins are formed using a standard etch process. Subsequent to the formation of the fins, device regions are created through shallow trench isolation (STI) within the starting substrate. In a preferred embodiment, the shallow trenches are filled with one or more insulating materials 108, such as silicon dioxide ($SiO_2$), to isolate the fins from each other. This prevents electrical current leakage between adjacent semiconductor device components, preventing one device region from affecting another or shorting out through contact with another.

Figure 3A:
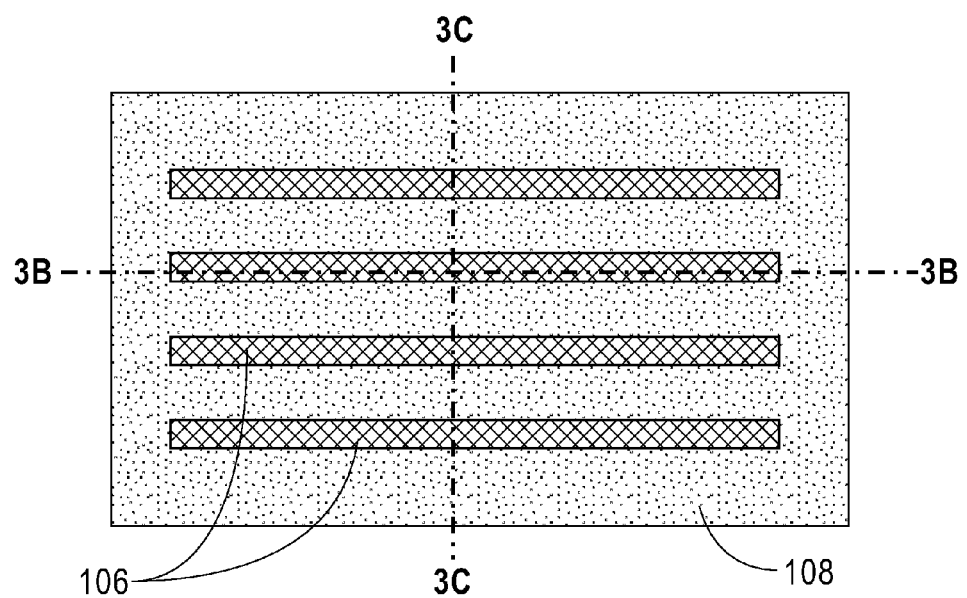
FIGS. 3A-C depict a plan view and cross-sectional views of the selective oxidation of one of the starting semiconductor substrate layers, in accordance with an embodiment of the present invention.
Figure 3B:
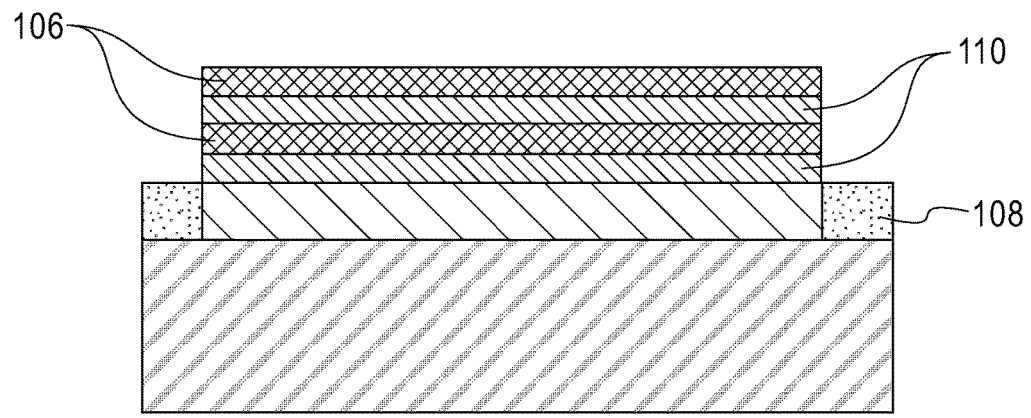
Figure 3C:
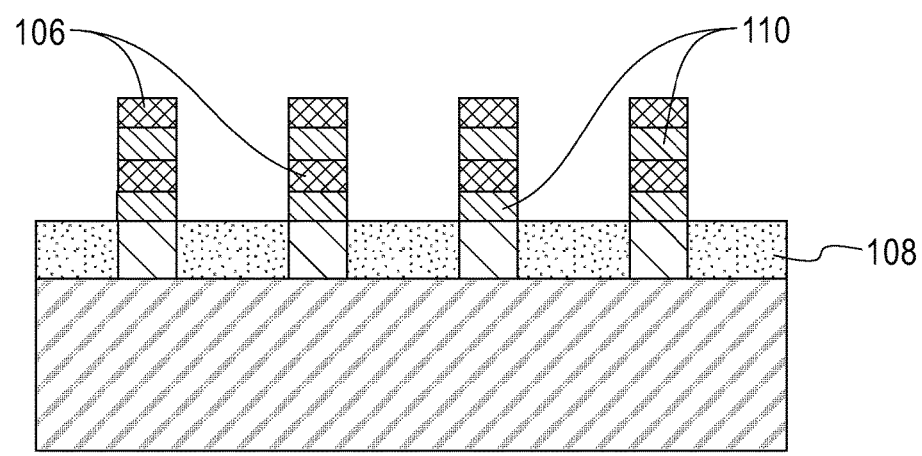

Referring now to FIGS. 3A-3C, FIG. 3A is a plan view of the processing step of selective oxidation of layer 104 of the starting substrate, FIG. 3B is a cross-sectional view of FIG. 3A, taken along the line 3B-3B, and FIG. 3C is a cross-sectional view of FIG. 3A, taken along the line 3C-3C. The starting substrate is exposed at a temperature between 350° C. to 550° C. in water vapor, to selectively oxidize layer 104 (AlAs in this embodiment) to become oxidized layer 110. The composition of layer 104 is initially chosen to be more readily oxidized than layer 106, and also as a close lattice match to layer 106. Oxidized layer 110 acts as an insulating layer within the stacked crystalline structure. In this exemplary embodiment, oxidized layer 110 is composed of aluminum oxide ($Al_2O_3$).

Figure 4A:
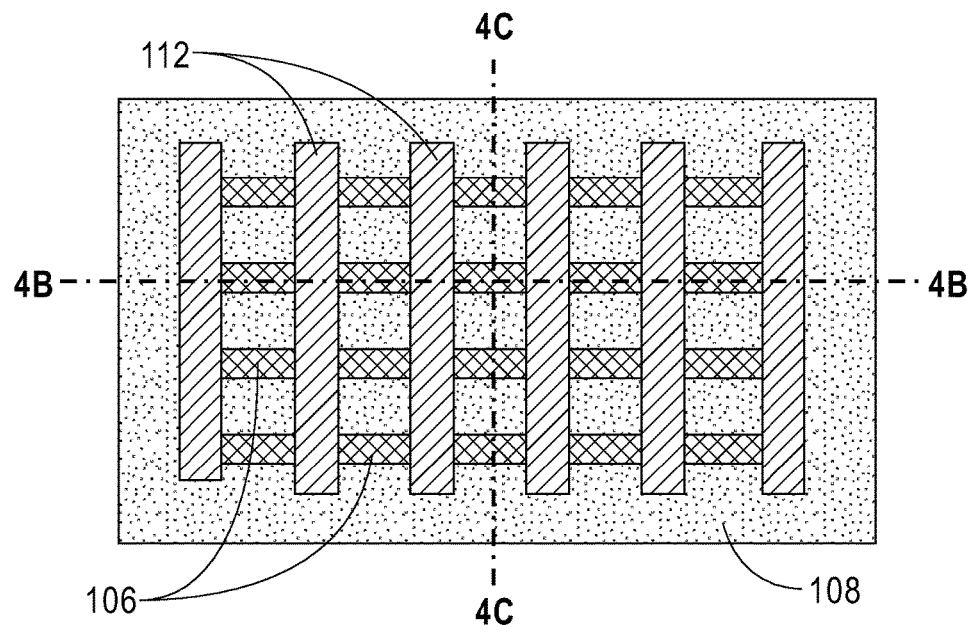
FIGS. 4A-C depict a plan view and cross-sectional views of the formation of dummy gates in the device regions created in FIGS. 2A-C, in accordance with an embodiment of the present invention.
Figure 4B:
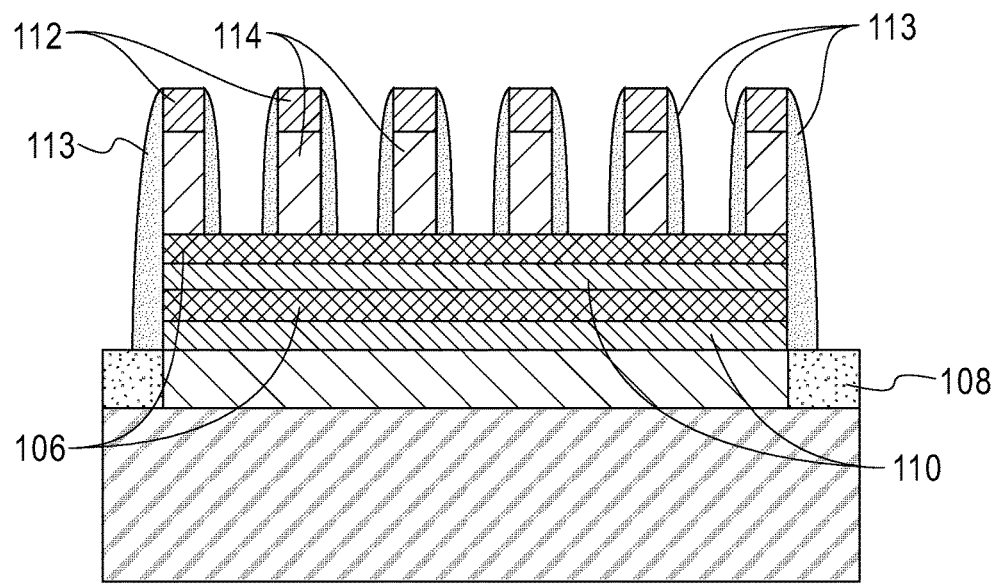
Figure 4C:
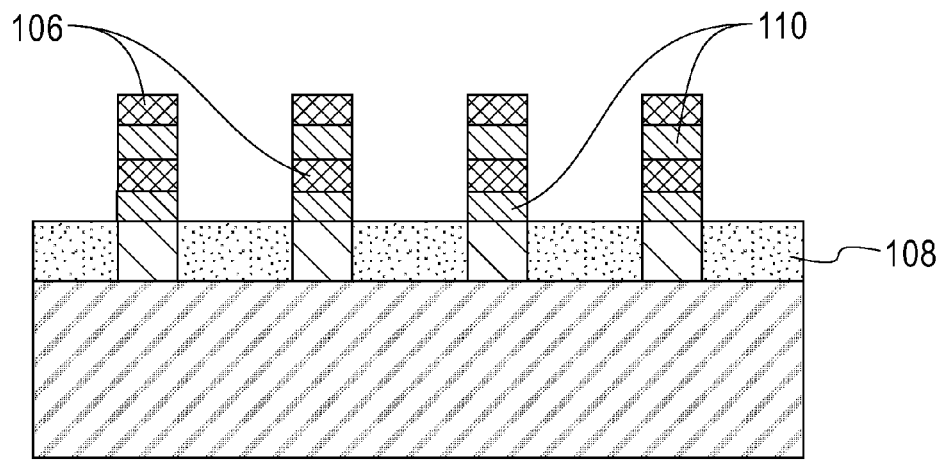

Referring now to FIGS. 4A-4C, FIG. 4A is a plan view of the processing step of dummy gates 112 and sidewall spacers 113 in the fin regions on the starting substrate, FIG. 4B is a cross-sectional view of FIG. 4A, taken along the line 4B-4B, and FIG. 4C is a cross-sectional view of FIG. 4A, taken along the line 4C-4C. Dummy gates 112 (i.e., sacrificial gate structures) are formed and, after formation of source and drain regions 116 (depicted in FIGS. 5A-D), may be selectively etched and replaced. One exemplary process for forming dummy gates 112 comprises depositing a dielectric layer over the starting substrate and a polysilicon layer over the dielectric layer. A lithography/gate etch process removes unnecessary portions of the stacked layers to leave dummy gates 112, comprised of a gate oxide (not pictured) and polysilicon layer 114. Ultimately, dummy gates 112 may be comprised of any material that can be etched selectively to the underlying upper semiconductor layer. A set of sidewall spacers 113 are formed adjacent to dummy gates 112, i.e., in direct contact with the sidewall of dummy gate 112. A sidewall spacer typically has a width ranging from 2 nm to 15 nm, as measured from the sidewall of a gate structure. Sidewall spacers 113 may be composed of a dielectric, such as a nitride, oxide, oxynitride, or a combination thereof. In one embodiment, sidewall spacers 113 are composed of silicon nitride ($Si_3N_x$). Those skilled in the art will recognize that a "set" of sidewall spacers 113 may actually comprise a single spacer formed around the entire gate.

Figure 5A:
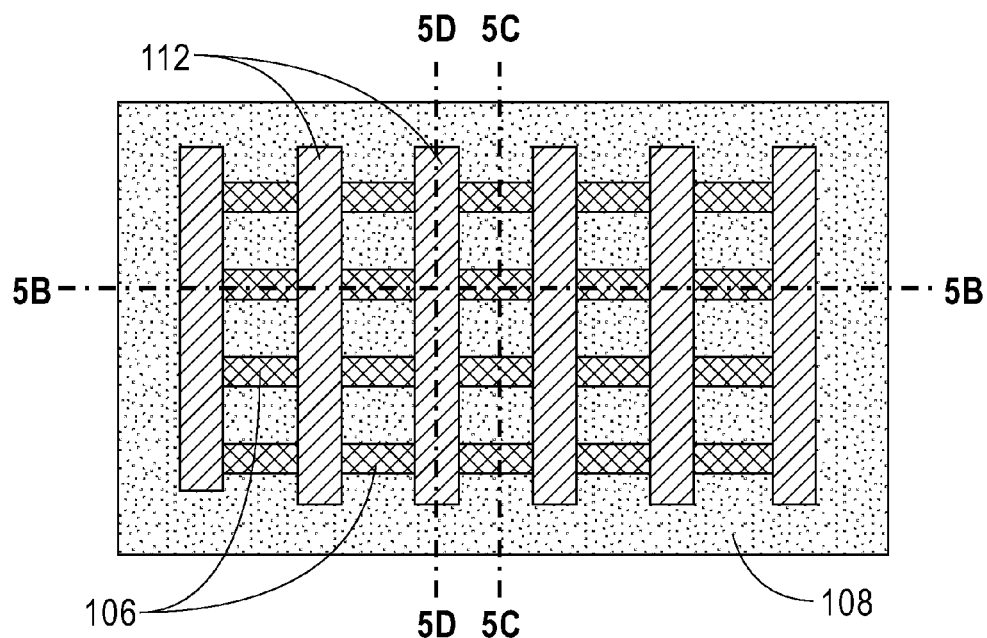
FIGS. 5A-D depict a plan view and cross-sectional views of the formation of source and drain regions on either side of the dummy gates of FIGS. 4A-C, in accordance with an embodiment of the present invention.
Figure 5B:
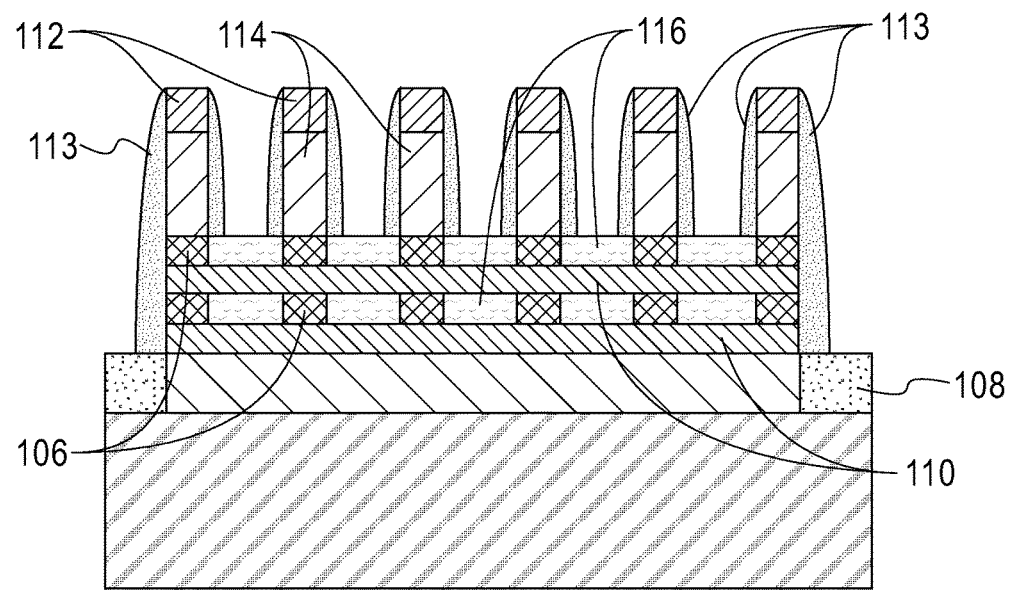
Figure 5C:
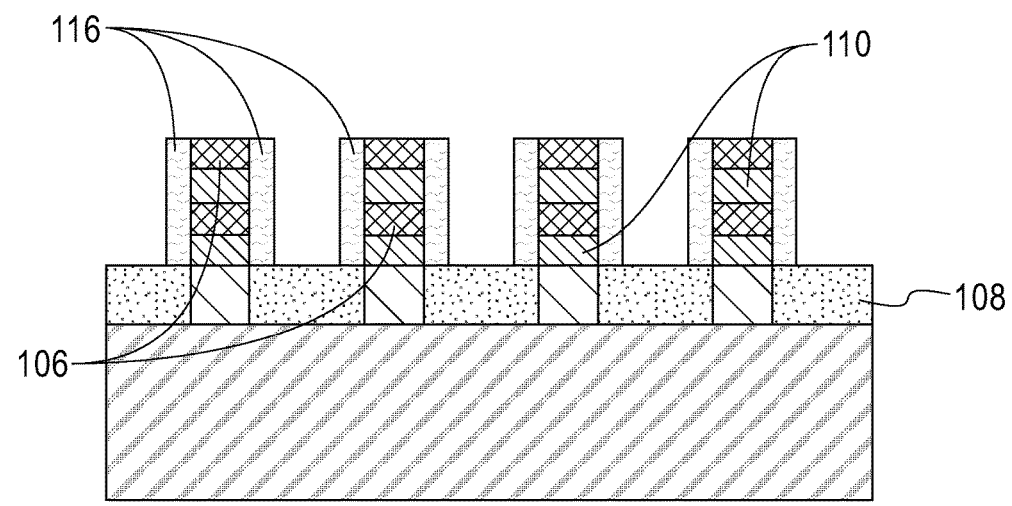
Figure 5D:
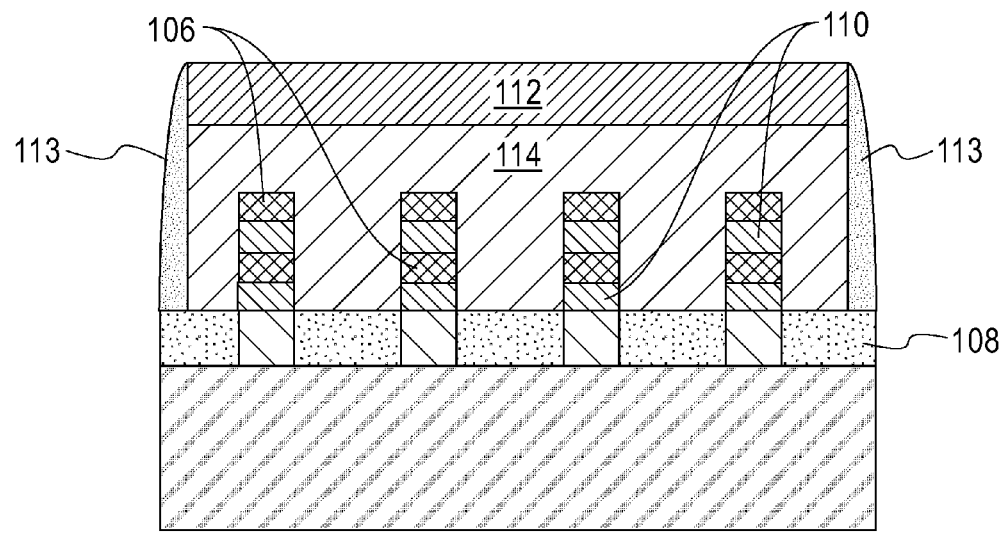

Referring now to FIGS. 5A-D, FIG. 5A is a plan view of the processing step of source and drain regions 116 formation, FIG. 5B is a cross-sectional view of FIG. 5A, taken along the line 5B-5B, FIG. 5C is a cross-sectional view of FIG. 5A, taken along the line 5C-5C, and FIG. 5D is a cross-sectional view of FIG. 5A, taken along the line 5D-5D. Source and drain regions 116 formation includes a number of high-temperature steps (e.g., implants and anneals). In this exemplary embodiment, source and drain regions 116 are formed using epitaxy. In another embodiment, source and drain regions 116 are formed using an ion implantation process.

Figure 6A:
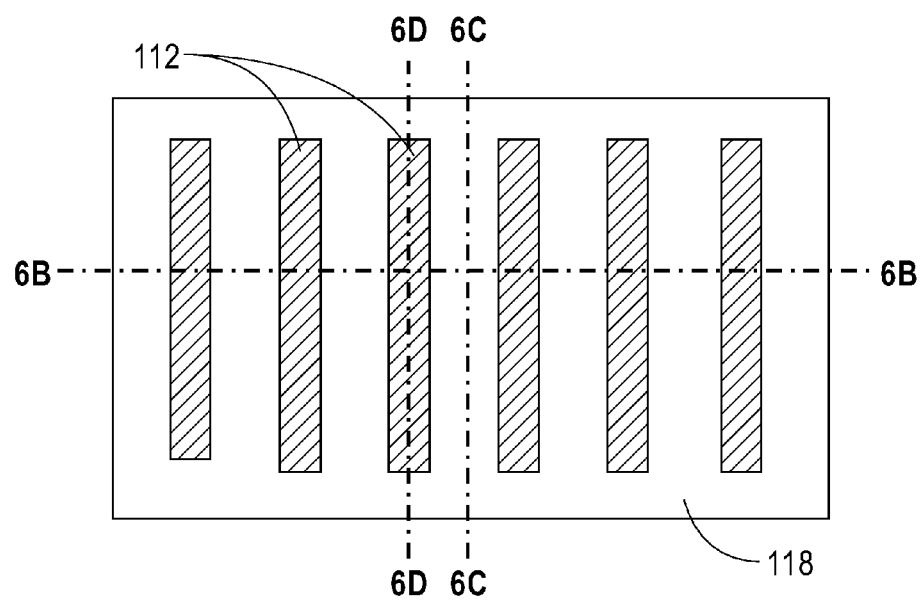
FIGS. 6A-D depict a plan view and cross-sectional views of the deposition of an insulator layer over the device regions of FIGS. 2A-C, covering the source and drain regions of FIGS. 5A-D, and the subsequent planarization of the insulator layer to expose the tops of the dummy gates created in FIGS. 4A-C, in accordance with an embodiment of the present invention.
Figure 6B:
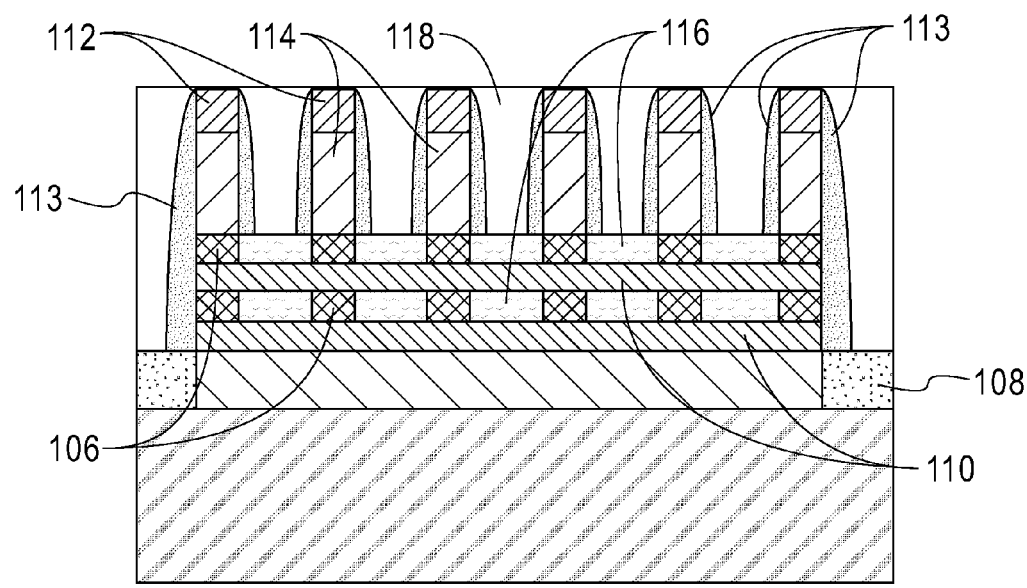
Figure 6C:
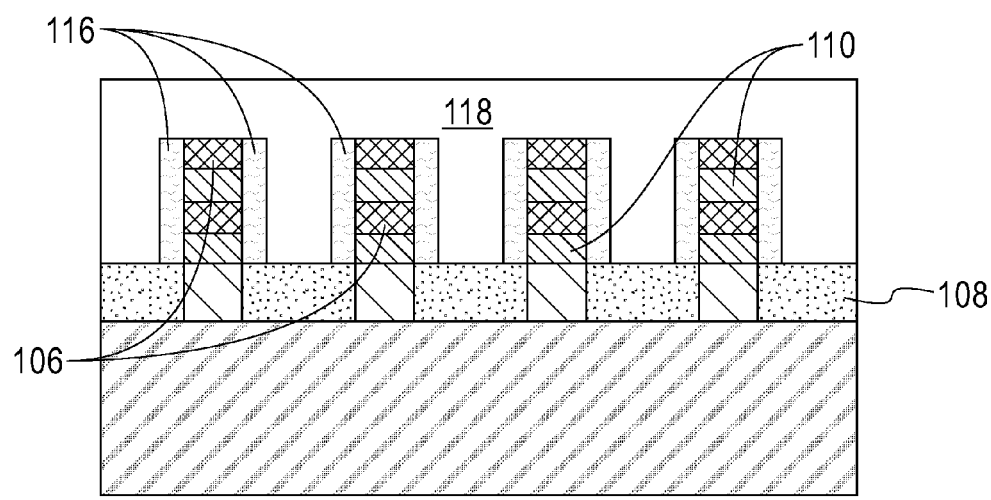
Figure 6D:
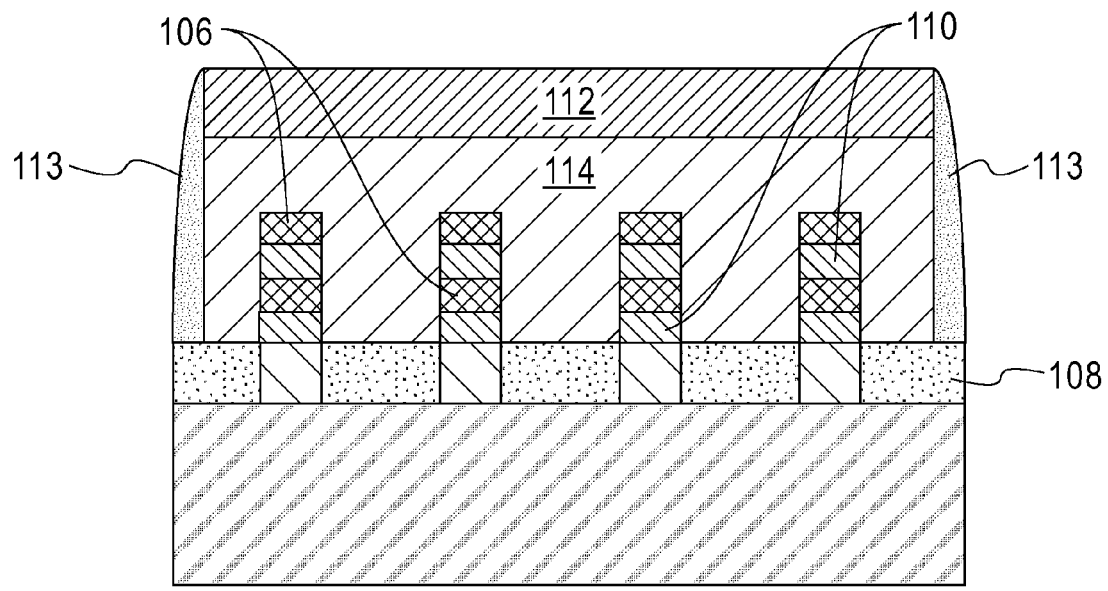

Referring now to FIGS. 6A-6D, FIG. 6A is a plan view of the processing step of depositing insulator 118, FIG. 6B is a cross-sectional view of FIG. 6A, taken along the line 6B-6B, FIG. 6C is a cross-sectional view of FIG. 6A, taken along the line 6C-6C, and FIG. 6D is a cross-sectional view of FIG. 6A, taken along the line 6D-6D. Insulator 118 is planarized using a standard planarization method in the art, and may be deposited using, for example, chemical vapor deposition (CVD). Variations of CVD processes may also be used, including, but not limited to, atmospheric pressure CVD (APCVD), low pressure CVD (LPCVD), and plasma enhanced CVD (PECVD). Other deposition techniques may also be used. Following deposition of insulator 118, insulator 118 is planarized until the upper surfaces of dummy gates 112 are exposed. Planarization is a material removal process that employs at least mechanical forces, such as frictional media, to produce a planar surface. In one embodiment, the planarization process includes chemical mechanical polishing (CMP) or grinding. CMP is a material removal process which uses both chemical reactions and mechanical forces to remove material and planarize a surface. The preferred method for exposing polysilicon layer 114 is known as poly open planarization (POP) chemical mechanical planarization (CMP), or poly open CMP.

Figure 7A:
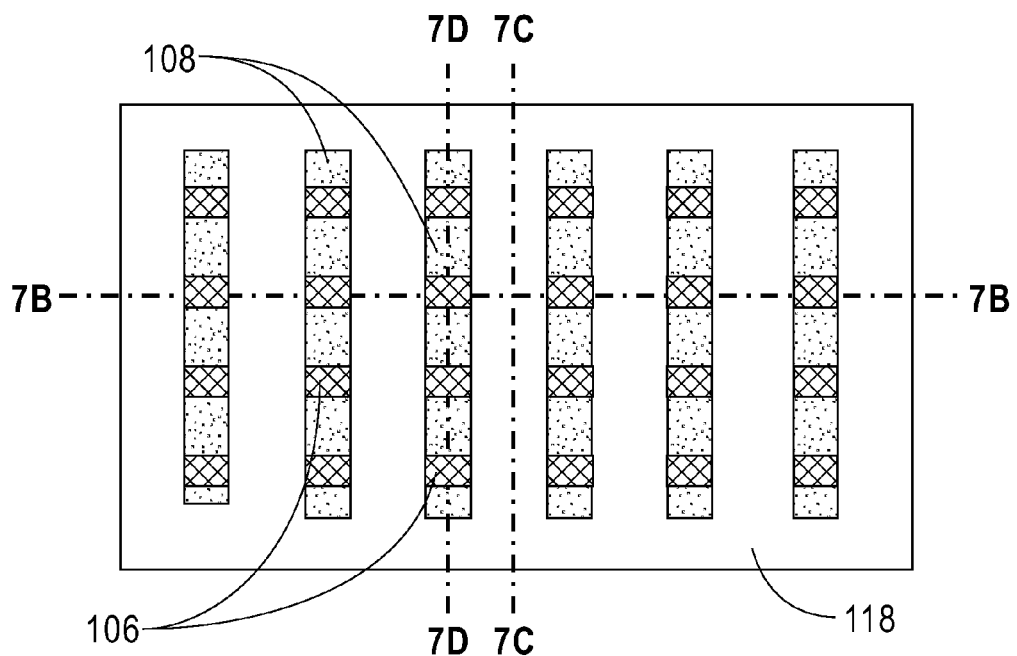
FIGS. 7A-D depict a plan view and cross-sectional views of the removal of the dummy gates created in FIGS. 4A-C, in accordance with an embodiment of the present invention.
Figure 7B:
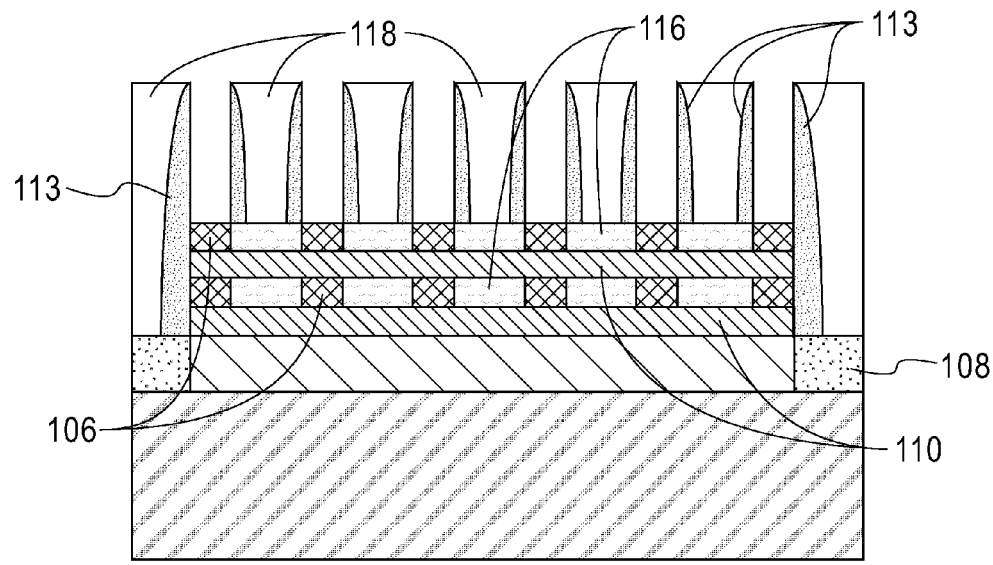
Figure 7C:
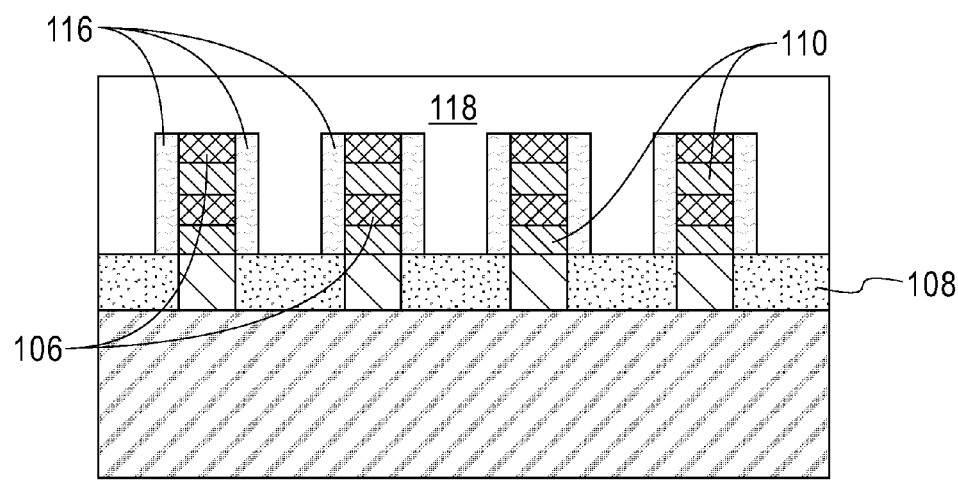
Figure 7D:
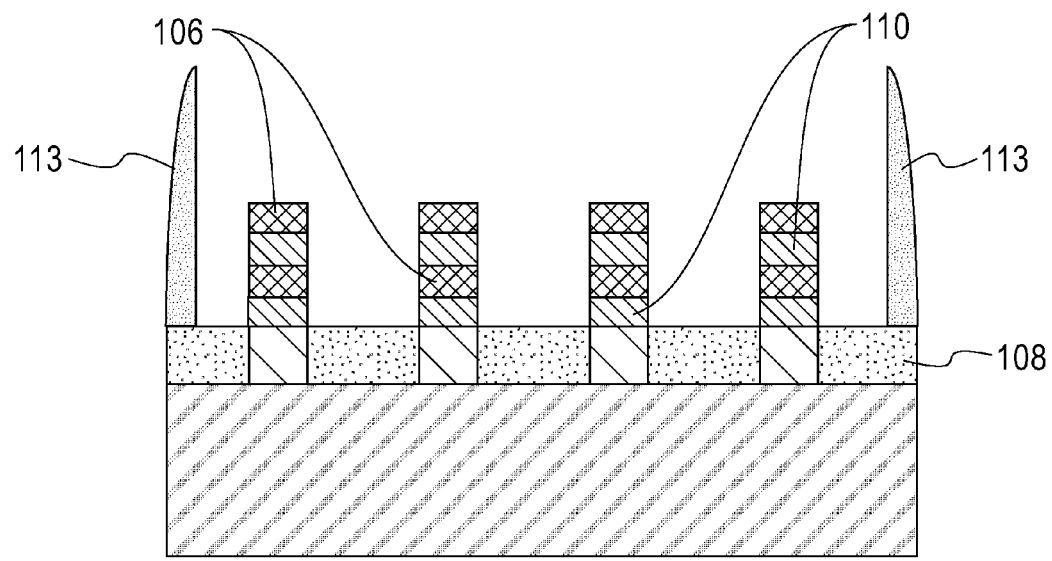

Referring now to FIGS. 7A-7D, FIG. 7A is a plan view of the processing step of the removal of dummy gates 112, FIG. 7B is a cross-sectional view of FIG. 7A, taken along the line 7B-7B, FIG. 7C is a cross-sectional view of FIG. 7A, taken along the line 7C-7C, and FIG. 7D is a cross-sectional view of FIG. 7A, taken along the line 7D-7D. Once the gate stack is exposed, dummy gates 112 are removed through a selective etch process, selective to the substrate/channel material and sidewall spacers 113. In this exemplary embodiment, a first etch removes polysilicon layer 114 and is selective to sidewall spacers 113. The etchant may be an isotropic etch or an anisotropic etch. One example of an isotropic etch is a wet chemical etch. The anisotropic etch may include reactive-ion etching (RIE). Other examples of anisotropic etching that can be used during this process include ion beam etching, plasma etching, or laser ablation.

Figure 8A:
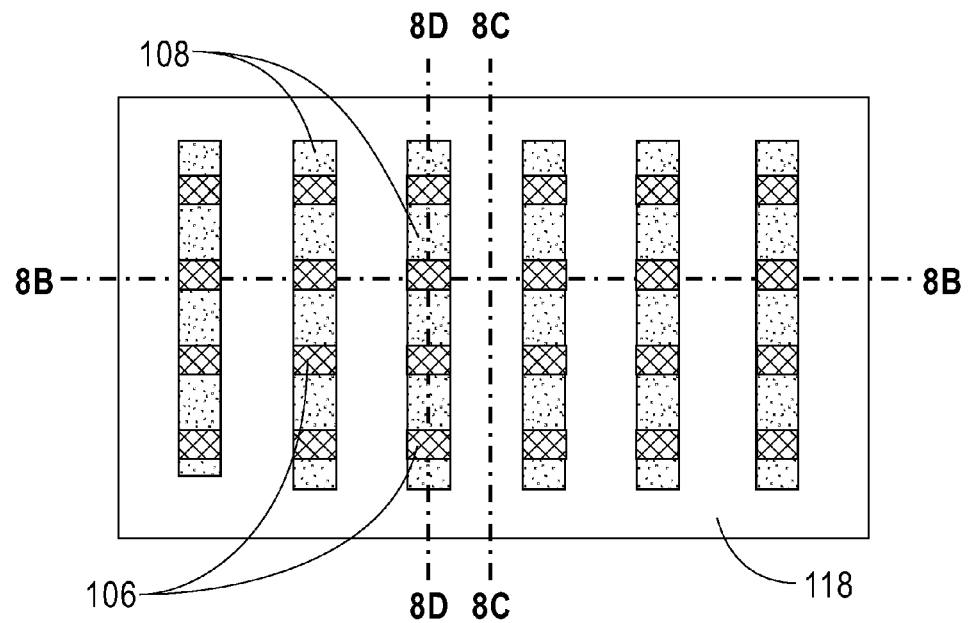
FIGS. 8A-D depict a plan view and cross-sectional views of the release of the selectively oxidized layer created in FIGS. 3A-C, in accordance with an embodiment of the present invention.
Figure 8B:
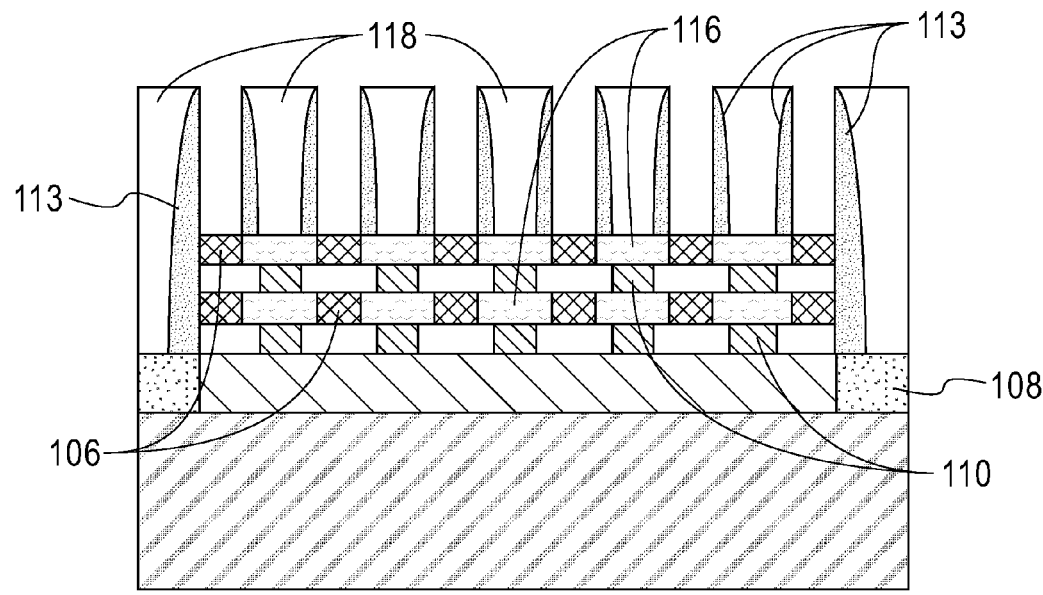
Figure 8C:
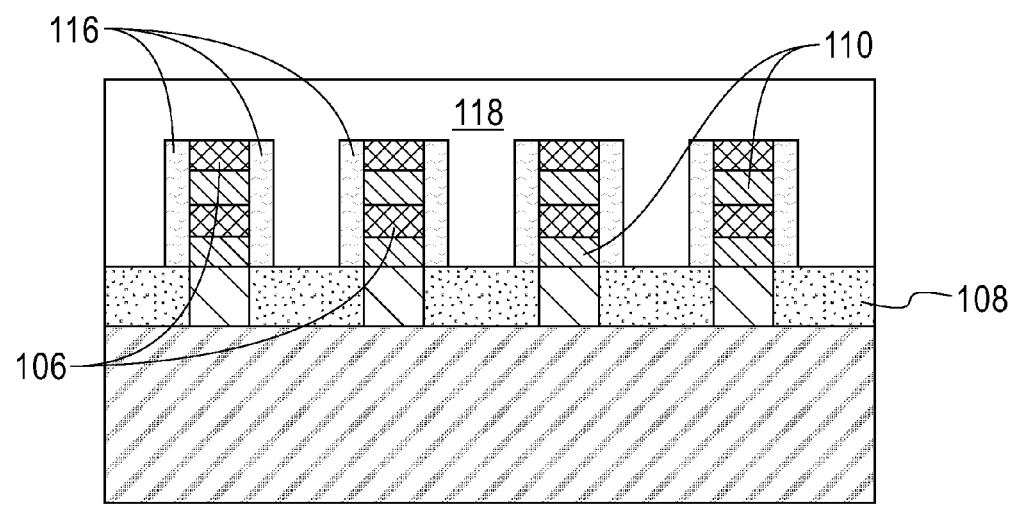
Figure 8D:
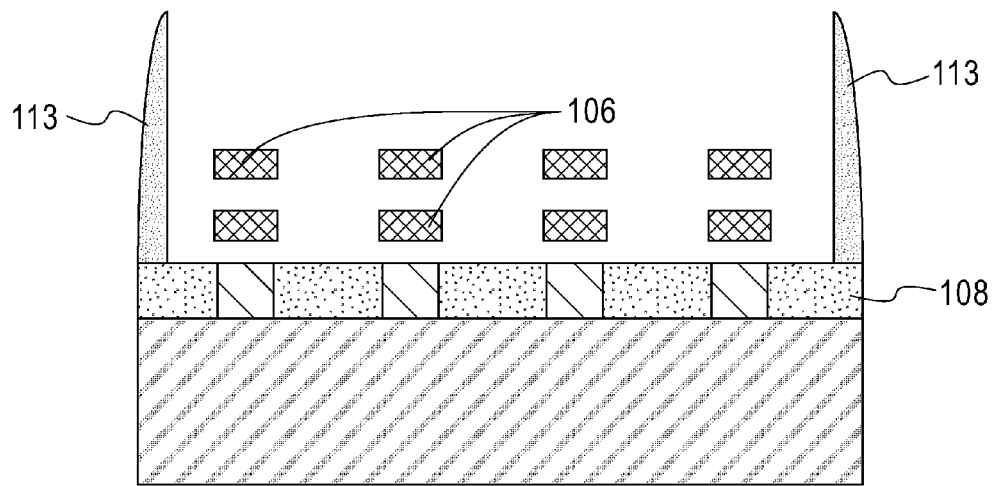

Referring now to FIGS. 8A-8D, FIG. 8A is a plan view of the processing step of the release of layer 110 ($Al_2O_3$), FIG. 8B is a cross-sectional view of FIG. 8A, taken along the line 8B-8B, FIG. 8C is a cross-sectional view of FIG. 8A, taken along the line 8C-8C, and FIG. 8D is a cross-sectional view of FIG. 8A, taken along the line 8D-8D. In this exemplary embodiment, an etching process known in the art, use of dilute hydrofluoric acid (HF), is used to etch layer 110 selectively over sidewall spacers 113, channel layer 106, and dielectric insulator 118.

Figure 9A:
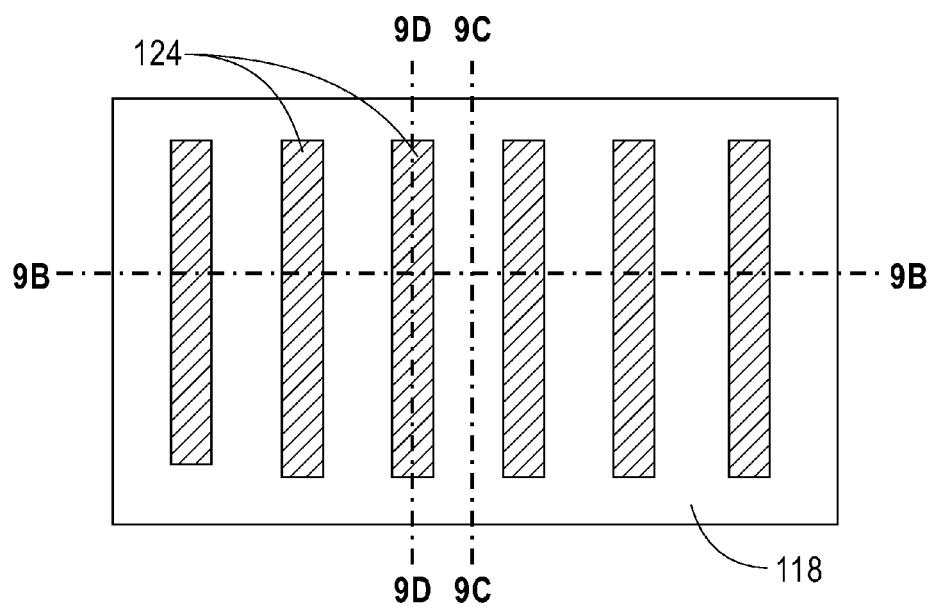
FIGS. 9A-D depict a plan view and cross-sectional views of depositing a high-K dielectric and forming replacement gates between sets of sidewall spacers, in accordance with an embodiment of the present invention.
Figure 9B:
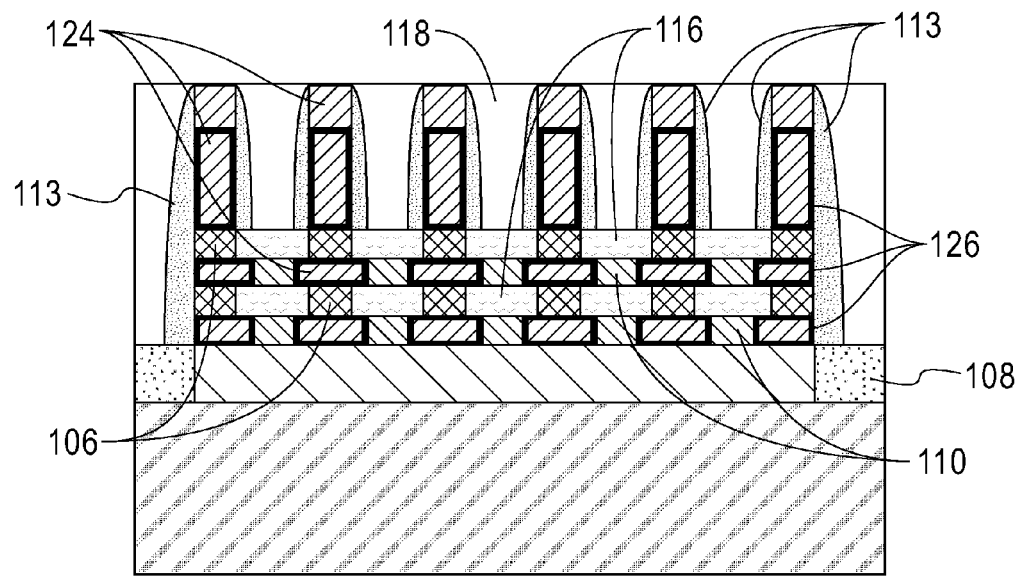
Figure 9C:
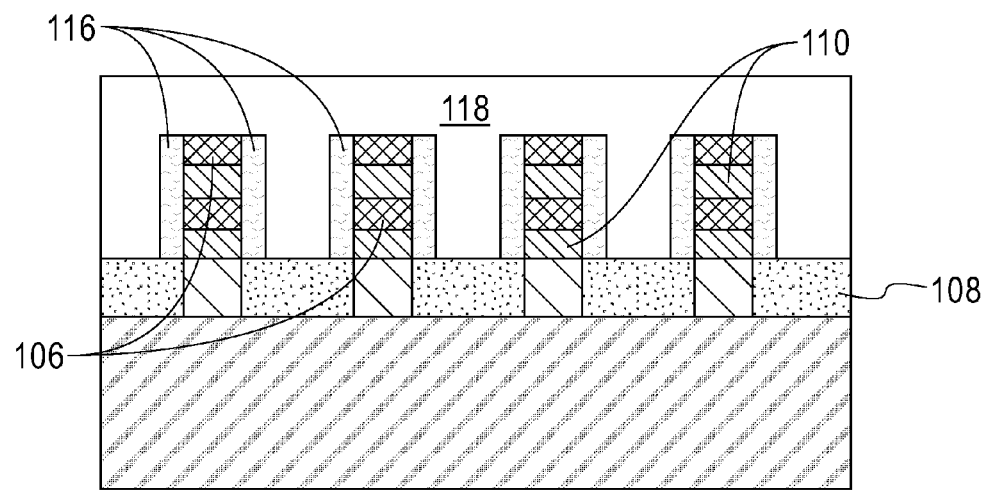
Figure 9D:
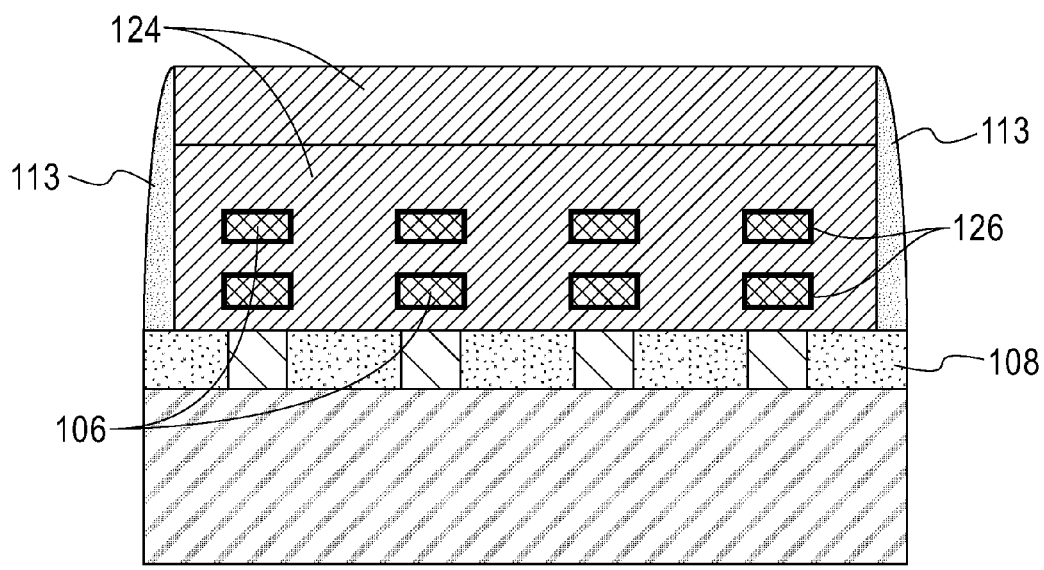

Referring now to FIGS. 9A-D, FIG. 9A is a plan view of the processing step of the deposition of high dielectric, or high-K material 126 and formation of replacement gates 124, FIG. 9B is a cross-sectional view of FIG. 9A, taken along the line 9B-9B, FIG. 9C is a cross-sectional view of FIG. 9A, taken along the line 9C-9C, and FIG. 9D is a cross-sectional view of FIG. 9A, taken along the line 9D-9D. High-K material 126 may be composed of, for example, hafnium (II) oxide (HfO), zirconium (II) oxide (ZrO), or titanium (II) oxide (TiO). Replacement gates 124 are formed between the existing sidewall spacers 113, and may be composed of any metal, for example, tungsten (W) or copper (Cu). High-K material 126 is deposited around the formed replacement gates 124. Standard middle of the line and back end of the line (BEOL) processes known in the art may be performed to complete the semiconductor chip (not depicted).

Having described the preferred embodiments of a method for selectively oxidizing layers within a III-V semiconductor device (which are intended to be illustrative and not limiting), it is noted that modifications and variations may be made by persons skilled in the art in light of the above teachings. It is, therefore, to be understood that changes may be made in the particular embodiments disclosed which are within the scope of the invention, as outlined by the appended claims.

In certain embodiments, the fabrication steps depicted above may be included on a semiconductor substrate consisting of many devices and one or more wiring levels to form an integrated circuit chip. The resulting integrated circuit chip(s) can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications, to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

What is claimed is:

1. A method for fabricating a semiconductor device with selective oxidation, the method comprising:

depositing a stack of two crystalline semiconductor layers over a base layer, wherein the base layer comprises a semiconductor substrate and a first insulator layer, and wherein the semiconductor substrate is 100 nanometers to 1 micrometer in thickness;

performing shallow trench isolation within the base layer to form a plurality of trenches that expose a set of sides of the two crystalline semiconductor layers;

depositing a second insulator layer into the plurality of trenches of the base layer;

selectively oxidizing a first of the two crystalline semiconductor layers to yield a selectively oxidized layer that serves as an insulator for a second of the two crystalline semiconductor layers, wherein the stack of two crystalline semiconductor layers maintain a layered configuration after oxidation of the first of the two crystalline semiconductor layers;

forming a dummy gate structure, wherein a set of spacers are along sides of the dummy gate structure;

forming source and drain regions in contact with each exposed side of the set of sides of the oxidized first semiconductor layer and the second semiconductor layer of the two crystalline semiconductor layers;

depositing an insulating material;

planarizing the deposited insulator material until the dummy gate structure is exposed;

removing the dummy gate structure;

etching the selectively oxidized crystalline semiconductor layer;

forming a replacement gate layer between a plurality of walls within the set of spacers;

depositing a high-K insulator around the replacement gate layer; and rendering a second of the two crystalline semiconductor layers as a channel region.

2. The method of claim 1, further comprising:
performing middle of the line and back end of the line (BEOL) processes to furnish the semiconductor device.

3. The method of claim 1, wherein the stack of two crystalline semiconductor layers comprises the first layer of the two crystalline semiconductor layers that is readily oxidized to an insulator-type material in comparison to the second layer of the two crystalline semiconductors.

4. The method of claim 1, wherein the semiconductor substrate stack of two crystalline semiconductor layer is exposed at a temperature that is greater than or equal to 350° C. and less than or equal to 550° C.

5. The method of claim 1, wherein the source region and the drain region are formed using an ion implantation process or epitaxy.

6. The method of claim 1, wherein etching the selectively oxidized crystalline semiconductor layer is selective, at least in part, to the set of spacers, the channel region, and the insulating material.

7. The method of claim 1, wherein selectively oxidizing one of the two crystalline semiconductor layers occurs after depositing the stack of two crystalline semiconductor layers over the base layer.

8. The method of claim 1, where the set of spacers are composed of: a nitride, an oxide, or an oxynitride.

* * * * *